United States Patent [19]

Nishizawa et al.

[11] Patent Number: 4,472,638

[45] Date of Patent: Sep. 18, 1984

[54] TWO-DIMENSIONAL SOLID-STATE IMAGE SENSOR

[75] Inventors: Jun-ichi Nishizawa, Sendai; Masahiro Konishi, Minami-Ashigara, both of Japan

[73] Assignee: Fuji Photo Film Co., Ltd., Japan

[21] Appl. No.: 326,880

[22] Filed: Dec. 2, 1981

[30] Foreign Application Priority Data

Dec. 5, 1980 [JP] Japan ................... 55-171897

[51] Int. Cl.³ .............................................. H01J 40/14
[52] U.S. Cl. ................................ 250/578; 250/211 J
[58] Field of Search ............... 250/211 R, 211 S, 578; 357/29, 30, 31, 32, 24 LR; 358/212, 213

[56] References Cited

U.S. PATENT DOCUMENTS 4,264,930 4/1981 White .................................. 358/213
4,328,425 5/1982 Stoffel ................................. 250/578
4,328,426 5/1982 D'Ortenzio ..................... 250/211 J
4,367,534 1/1983 Herbst et al. ...................... 250/578

Primary Examiner—David C. Nelms
Attorney, Agent, or Firm—McGlew and Tuttle

[57] ABSTRACT

A two-dimensional solid-state image sensor which is equipped with an image processing function and hence is able to directly output image information subjected to two-dimensional image processing. The two-dimensional solid-state image sensor is provided with a photoelectric converter having non-destructive readout type image sensor cells arranged in a matrix form; a scanner for scanning the photoelectric converter in such a manner that stored information of each image sensor cell is read out together with stored information of other image sensor cells bearing predetermined positional relationships to the image sensor cell to be read out; and an arithmetic unit for conducting predetermined operations for the plurality of stored information read out by the scanner to output an image signal subjected to two-dimensional image processing.

4 Claims, 8 Drawing Figures

TWO-DIMENSIONAL SOLID-STATE IMAGE SENSOR

BACKGROUND OF THE INVENTION

1. Field of the Invention

The present invention relates to a two-dimensional solid-state image sensor which is equipped with an image processing function.

2. Description of the Prior Art

An image picked up by a two-dimensional solid-state image sensor is an assembly of discrete image information spatially sampled in two dimensions. In the prior art, the image data is subjected to two-dimensional image processing for improvement of image quality and for other purposes.

FIG. 1 is a block diagram showing a prior art example involving such image processing. In this case, two-dimensional image processing for increasing the sharpness of image, removal of noise and so forth is performed by conducting a convolution of each image data f(x, y) from a photoelectric converter or optoelectro transducer unit 100 and a predetermined two-dimensional weight function.

In FIG. 1, the photoelectric converter 100 has image sensor cells $P_{11}$ to $P_{mn}$ arranged in a matrix form and the picture element cells are formed, for example, by CCDs, BBDs or the like. Accordingly, image information $G_{11}$ to $G_{mn}$ of the image sensor cells $P_{11}$ to $P_{mn}$ are read out only in the form of a one-dimensional time series signal. In the prior art, as shown in FIG. 1, the read-out signal is delayed by delay circuits 101 and 102 to obtain image information $G_{i,j-1}$, $G_{i,j}$ and $G_{i,j+1}$ of the same timing, which are multiplied by predetermined constants $\alpha_1$ to $\alpha_3$ in multipliers 103 to 105, respectively, and the multiplied outputs are added together by an adder 106, thus performing one-dimensional image processing first. Since the photoelectric conversion elements or optoelectro transducers, such as the CCDs and BBDs, are the destructive readout type, the result of the abovesaid operation is once loaded in digital form in a buffer memory 107 which has memory areas $P'_{11}$ to $P'_{mn}$ respectively corresponding to the image sensor cells of the photoelectric converter 100. Then, the contents of the buffer memory 107 are read out therefrom in a direction perpendicular to the direction of readout of the photoelectric converter 100. The output from the buffer memory 107 is subjected to the same operation as the aforesaid one by a circuit composed of delay circuits 108 and 109, multipliers 110 to 112 and an adder 113, thereby performing two-dimensional image processing.

As will be seen from the above, in the case where an image picked up by a two-dimensional solid-state image sensor is subjected to two-dimensional image processing for improvement of image quality as well as image analysis, it is impossible in the prior art to perform the two-dimensional image processing until after signals subjected to the one-dimensional image processing have once been loaded in an external buffer memory of large capacity. Accordingly, the prior art requires a very complex circuit arrangement involving a buffer memory of the capacity corresponding to the image sensor cells and an A-D converter for loading signals in the buffer memory and, further, cells for the provision of the large capacity buffer memory on the outside of the device. Therefore, in the prior art, the image processing function cannot be provided in the solid-state image sensor. Moreover, since signals are subjected to the image processing outside the solid-state image sensor and passed through many circuits, the signals are liable to be affected by noise, presenting a problem in terms of image processing performance, too.

SUMMARY OF THE INVENTION

It is therefore an object of the present invention to provide a two-dimensional solid-state image sensor which is equipped with the two-dimensional image processing function.

Another object of the present invention is to provide a two-dimensional solid-state image sensor which is capable of directly yielding image information subjected to two-dimensional image processing.

Still another object of the present invention is to provide a two-dimensional solid-state image sensor which is capable of performing two-dimensional image processing for increasing image sharpness, removal of noise and so forth with a simple and economical arrangement.

Briefly stated, the two-dimensional solid-state image sensor of the present invention is provided with a photoelectric converter or optoelectro transducer unit having non-destructive readout type image sensor cells arranged in a matrix form, a scanner for simultaneously reading out stored information of the image sensor cells, and an arithmetic unit for conducting predetermined operations of the image information read out by the scanner to perform two-dimensional image processing for increasing image sharpness, removing noise and so forth. The image sensor cells are each constituted by a photoelectric conversion element or optoelectro transducer having a hook structure. The image sensor cells are the non-destructive readout type, so that even if information of each image sensor cell is read out simultaneously with the other cells, information of the latter can be read out without hindrance.

DESCRIPTION OF THE PREFERRED EMBODIMENTS

Figure 2:
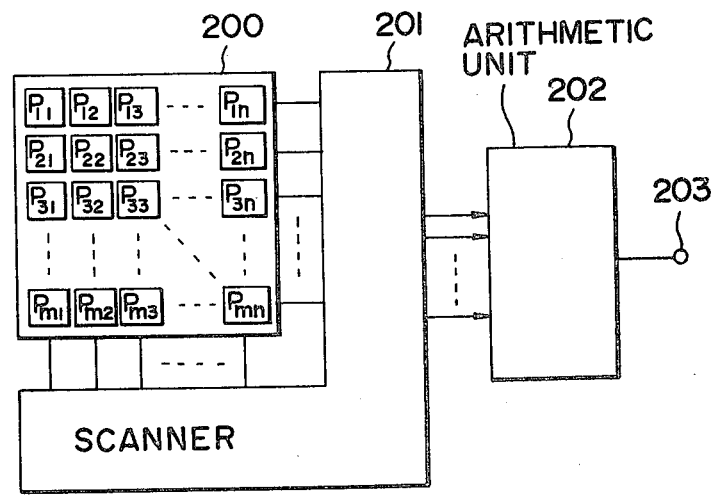
FIG. 2 is a block diagram illustrating the basic arrangement of the present invention.

FIG. 2 illustrates in block form the basic arrangement of the two-dimensional solid-state image sensor of the present invention which possesses the image processing function. In FIG. 2, reference numeral 200 indicates a photoelectric converter or optoelectro transducer unit; $P_{11}$ to $P_{mn}$ designate non-destructive readout type image sensor cells; 201 identifies a scanner; 202 denotes an arithmetic unit; and 203 represents an output terminal.

As shown in FIG. 2, the two-dimensional solid-state image sensor of the present invention has, as its basic components, the photoelectric converter 200 which has the non-destructive readout type image sensor cells $P_{11}$ to $P_{mn}$ arranged in a matrix form; the scanner 201 which scans the cell matrix in such a way that when reading out stored information of each image sensor cell, stored information of some other image sensor cells bearing predetermined positional relationships with the picture element to be read out are also read out; and the arithmetic unit 202 which receives the plurality of image information read out by the scanner 201 and conducts predetermined operations, outputting image information subjected to two-dimensional image processing.

Figure 1:
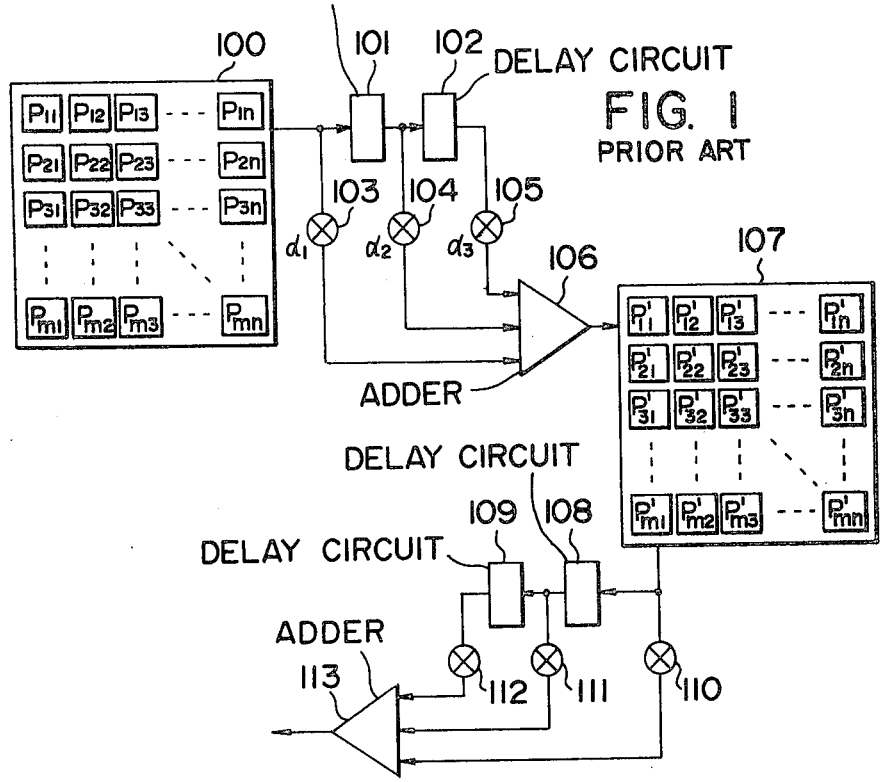
FIG. 1 is a block diagram showing a prior art example of an image sensor which performs two-dimensional image processing.

Since the photoelectric converter 200 is formed by the non-destructive readout type image sensor cells, stored information of each image sensor cell is retained even if read out a plurality of times. Therefore, even if stored information of one of the image sensor cell is read out together with the other picture elements, there is not provided any hindrance in reading out stored information of the other image sensor cells. Accordingly, information of a plurality of image sensor cells can be obtained concurrently, so that the delay circuits 101 and 102 needed in the prior art example of FIG. 1 are not required for the two-dimensional image processing. In addition, since the image sensor cells are the non-destructive readout type, the buffer memory and its associated circuiting in FIG. 1 become unnecessary. Thus, the circuit arrangement of the image sensor of the present invention is appreciably simplified as compared with the conventional circuit arrangement.

Figure 3:
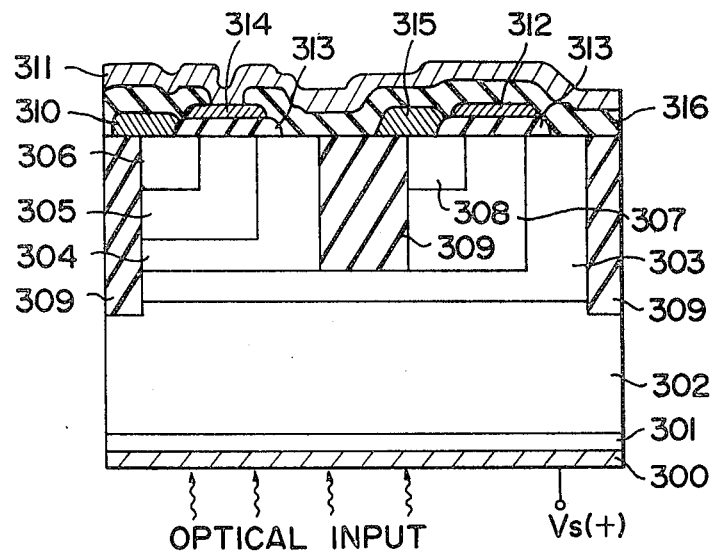
FIG. 3 is a sectional view illustrating an example of a non-destructive readout type image sensor cell for use in the present invention.
Figure 4:
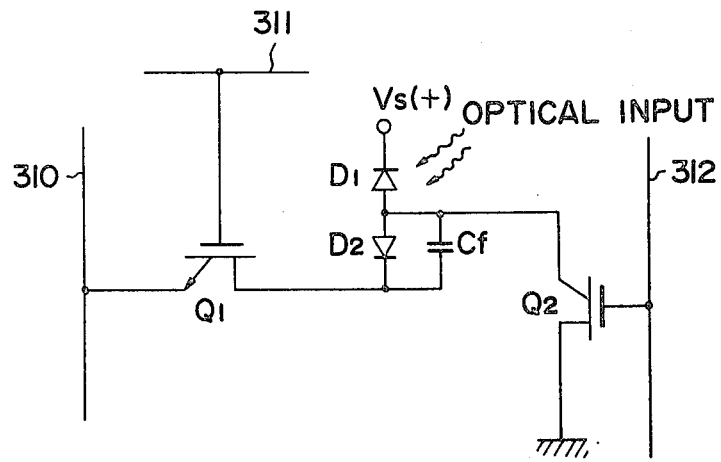
FIG. 4 is an equivalent circuit representation of the image sensor cell depicted in FIG. 3.

FIG. 3 illustrates in section an example of the non-destructive readout type image sensor cell for use in the present invention and FIG. 4 shows its equivalent circuit. In FIGS. 3 and 4, reference numeral 300 indicates a transparent electrode biased to a power source voltage $Vs(+)$; 301 designates an n+ region; 302 identifies a high resistivity region, for example, a p− region; 303 denotes a p+ region; 304 represents an n+ region; 305 shows a p region (a channel region); 306 refers to an n+ source region; 307 indicates an n region (a channel region); 308 designates a p+ source region; 309 identifies an isolation region formed of an insulator; 310 denotes a bit line; 311 represents a word line; 312 shows an erase line; 313 refers to a gate insulating film; 314 indicates a gate electrode; 315 designates a grounding electrode; 316 identifies an insulating layer; $Q_1$ denotes a readout transistor; $Q_2$ represents an erasing transistor; $D_1$ and $D_2$ show diodes; and Cf refers to a capacitance. The n+ region 301, the p− region 302, the p+ region 303 and the n+ region 304 form a hook structure. This hook structure is equivalently represented by a back-to-back connection of the diodes $D_1$ and $D_2$. The hood structure is thus a multi-layer semiconductor device which is like a transistor with an electrically floating base. The junction capacitance between the p+ region 303 and the n+ region 304 is represented by Cf. The n+ region 304, the p region 305 and the n+ region 306 correspond to the drain, gate and source of the readout transistor $Q_1$, respectively, and the p+ region 303, the n region 307 and the p+ region 308 correspond to the drain, gate and source of the erasing transistor $Q_2$, respectively.

Upon application of an optical input to the picture element cell in such a state in which the predetermined voltage $Vs(+)$ is applied to the transparent electrode 300 to deplete the p− region 302 throughout it so that carriers may travel therein at a saturated velocity, electron-hole pairs are generated in the p− region 302 in the vicinity of the n+ region 301. The electrons thus created are absorbed into the n+ region 301 but the holes are accelerated by an electric field and accumulated in the p+ region 303 to charge it positive. As a result of this, the barrier potential of the n+ region 304 for electrons drops, permitting electrons to flow out of the n+ region 304 into the p+ region 303 across the junction formed between the both regions held in the floating state. Thus, the n+ region 304 is biased positive.

The potential V(t) of the n+ region 304 is approximately given by the following expression relative to the light integration period of 0 to t sec:

$$V(t) = \frac{cq}{Cf} \int_0^t S(t)dt \qquad (1)$$

where S(t) is the photon density, c is the velocity of light and q is the unit quantity of positive charges. Hence a voltage corresponding to the optical input is obtained.

Turning ON the readout transistor $Q_1$ through the word line 311, the potential on the bit line 310 varies with the voltage of the n+ region 304, so that the information of the picture element can be read out by detecting the voltage variation on the bit line. In this case, since the n+ region 304 and the p+ region 303 are both held in the floating state, the diffusion potential of the junction therebetween becomes equivalently low and consequently, electrons having flowed into the n+ region 304 during the readout operation flow out therefrom towards the substrate across the p+ region 303. Accordingly, even after the readout transistor $Q_1$ is turned ON to read out the stored content, holes of optical information accumulated in the p+ region 303 can be retained, thus enabling non-destructive readout. The erasing transistor $Q_2$ is held in the OFF state during exposure and after exposure, it is turned ON to erase the holes accumulated in the p+ region 303 in preparation for the next exposure.

More detailed arrangements and modified forms of such a non-destructive readout type image sensor cell are disclosed in our prior U.S. patent application Ser. Nos. 254,046 and 265,383 and Japanese patent application No. 60316/80. In the present invention, the non-destructive readout type image sensor cell can be employed regardless of whatever arrangement it may have.

Figure 5:
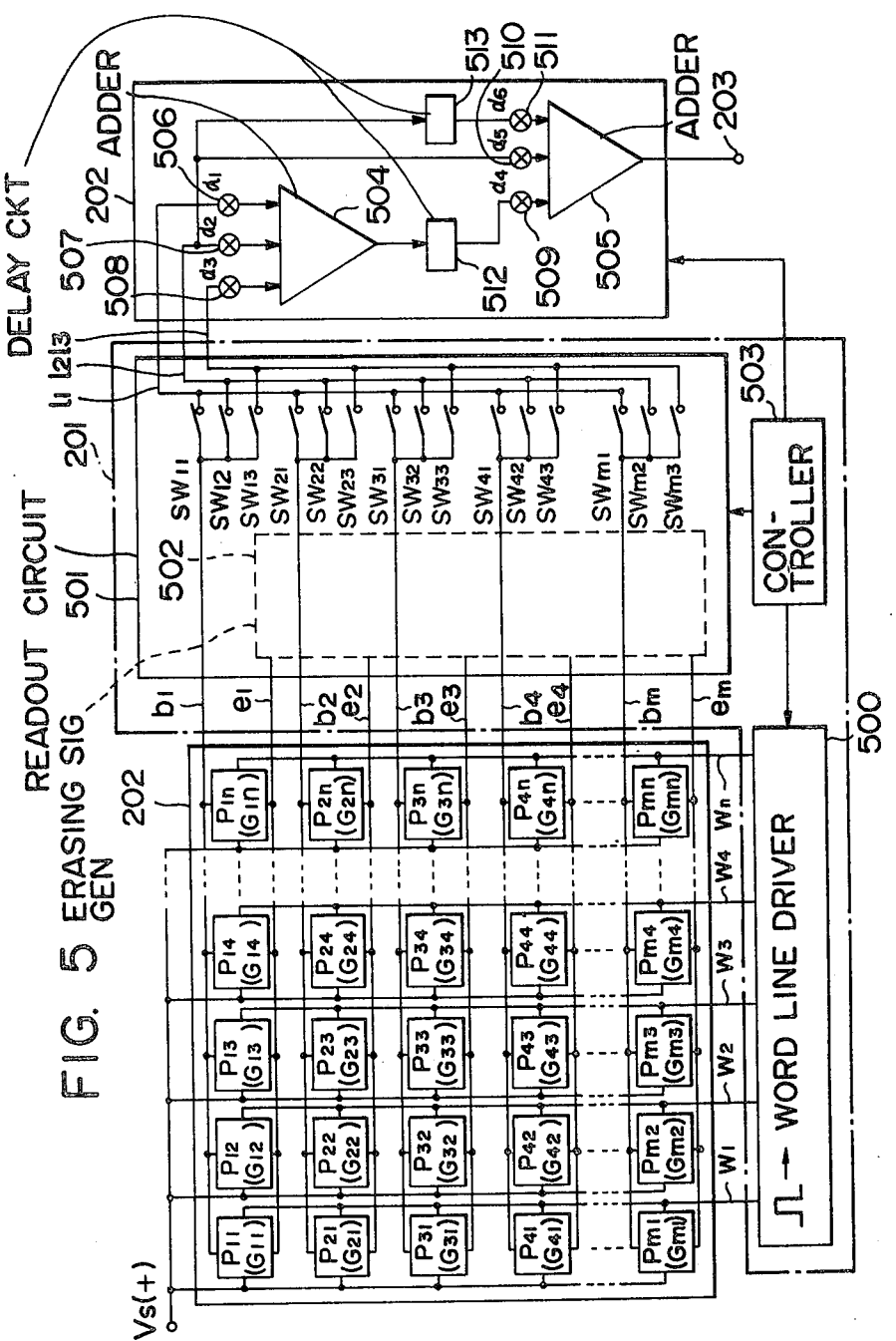
FIG. 5 is a block diagram illustrating the principal part of an embodiment of the present invention.

FIG. 5 illustrates in block form the principal part of an embodiment of the present invention which employs the photoelectric converter 200 using the image sensor cell of FIG. 3 as a basic picture element and which is adapted so that the two-dimensional image processing can be effected in the device. In FIG. 5, the parts corresponding to those in FIGS. 2, 3 and 4 are identified by the same reference numerals. Reference numeral 500 indicates a word line driver; $w_1$ to $w_n$ designate word lines; 501 identifies a readout circuit; 502 denotes an erasing signal generator; $b_1$ to $b_n$ represent bit lines; $e_1$ to $e_m$ show erase lines; 503 refers to a controller; $SW_{11}$ to $SW_{m3}$ indicate analog switches such as MOSFETs; $l_1$ to $l_3$ identify readout lines; 504 and 505 denote adders; 506 to 511 represent multipliers; 512 shows a delay circuit having a delay time of one picture element; and 513 refers to a delay circuit having a delay time of two picture elements.

The word line driver 500 is to apply pulse voltages to the word lines $w_1$ to $w_n$ at predetermined timing, thereby to sequentially select vertical picture element trains shown in FIG. 5. Stored information of the image sensor cells thus selected are provided on the bit lines $b_1$ to $b_m$ connected thereto. In the readout circuit 501, the bit lines $b_1$ to $b_m$ are each connected with three analog switches $SW_{11}$ to $SW_{m3}$, which are, in turn, connected to the different readout lines $l_1$ to $l_3$, respectively. Accordingly, it is possible to take information of a desired image sensor cell on a desired readout line by the word line driver 500 and the analog switches $SW_{11}$ to $SW_{m3}$. In addition, since three readout lines are provided, information of three image sensor cells can be read out simultaneously. It is a matter of course that the number of picture elements to be concurrently read out can freely be changed by altering the numbers of the analog switches and the readout lines used.

The erasing signal generator 502 is to erase the image information by providing an erasing signal on each of the erase lines $e_1$ to $e_m$. The controller 503 is to generate various control signals for the word line driver 500, the readout circuit 501 and the arithmetic unit 202.

The arithmetic unit 202, in the present embodiment, is formed to conduct a convolution of each image data $f(x, y)$ available from the photoelectric converter 200 and a predetermined two-dimensional weight function $h(u, v)$. The arithmetic unit 202 comprises multipliers 506 to 508 for multiplying the image data on the readout lines $l_1$ to $l_3$ by constants $\alpha_1$ to $\alpha_3$, respectively; an adder 504 for adding together the multiplied outputs; a delay circuit 512 for delaying the output from the adder 504 for a period of time corresponding to one picture element; another delay circuit 513 for delaying the image data on the readout line $l_2$ for a period of time corresponding to two picture elements; multipliers 509 to 511 for multiplying the output from the delay circuit 512, the image data on the readout line $l_2$ and the output from the delay circuit 513 by constants $\alpha_4$ to $\alpha_6$, respectively; and an adder 505 for adding together the multiplied outputs to yield a signal subjected to the two-dimensional image processing.

Generally, in a linear optical image device, letting an optical output distribution (commonly referred to as a point spreading function or two-dimensional weight function) caused by a point image input be represented by $h(x, y)$, an output $g(x, y)$ resulting from an image $f(x, y)$ is expressed by a superposition (indicated by convolution symbol *) of them and given by the following expression:

$$g(x, y) = f(x, y) * h(x, y) \quad (2)$$
$$= \int\int_{-\infty}^{\infty} f(x', y')h(x - x', y - y')dx'dy'$$

Figure 6A:
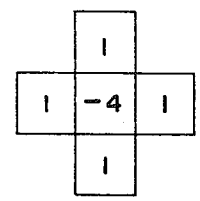
FIGS. 6A, 6B and 7 are explanatory of the operation of the embodiment shown in FIG. 5.
Figure 6B:
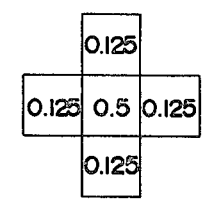

And it is well-known as Laplacian enhancement processing that the image sharpness can be increased by using, as the optical output distribution $h(x, y)$, functions such, for example, as shown in the form of values on the X-Y co-ordinates in FIG. 6(A). In general, various other processing can be effected by modifying the optical output distribution $h(x, y)$; for example, by the use of functions shown in FIG. 6(B), it is possible to decrease noise in an image.

Figure 7:
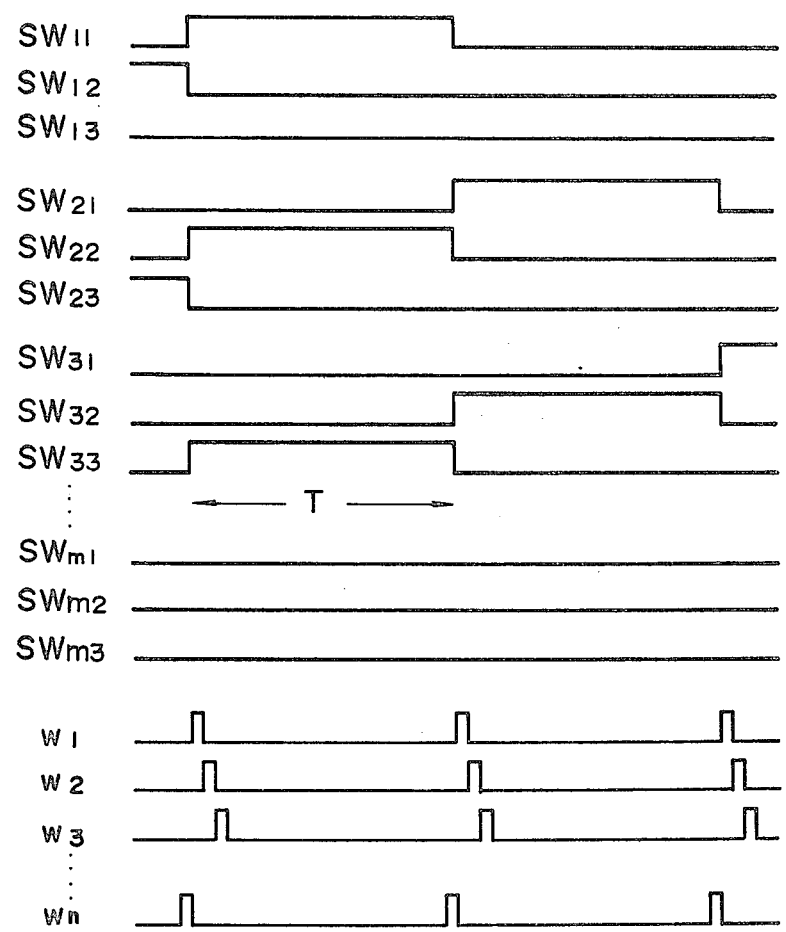

FIG. 7 is a timing chart showing the timing for conducting the analog switches $SW_{11}$ to $SW_{m3}$ and the timing for driving the word lines $w_1$ to $w_n$ in the case of performing the Laplacian enhancement processing shown in FIG. 6(A) is performed, with the multiplicators of the multipliers 506 to 511 set to $\alpha_1$, $\alpha_3$, $\alpha_5$, $\alpha_6 = -1$, $\alpha_2 = 4$ and $\alpha_4 = 1$, respectively. A description will be given, with reference to FIG. 7, of the operation of the device depicted in FIG. 6.

When sequentially selecting the word lines $w_1$ to $w_n$ in such a period in which only the analog switches $SW_{11}$, $SW_{22}$ and $SW_{33}$ are in the ON state while the others are all in the OFF state (this period corresponding to one horizontal scanning period), there are read out on the readout lines $l_1$ to $l_3$ stored information of three vertically arranged image sensor cells at one time in a sequential order $(G_{11}, G_{21}, G_{31})$, $(G_{12}, G_{22}, G_{32})$, ... $(G_{1n}, G_{2n}, G_{3n})$.

For example, when the word line $w_3$ is being selected, the image information $G_{13}$, $G_{23}$ and $G_{33}$ are read out on the readout lines $l_1$ to $l_3$, respectively, and the multipliers 506 to 508 perform multiplications $\alpha_1 G_{13}$, $\alpha_2 G_{23}$ and $\alpha_3 G_{33}$, respectively, and the adder 504 adds the multiplied values to obtain an added value $G'_{23}$. The added value $G'_{23}$ is information in which the image information $G_{23}$ has been made sharp in the vertical direction.

At that moment, the multipliers 509, 511 and 510 are supplied with information $G'_{22}$ resulting from the immediately preceding readout operation, image data $G_{21}$ and image data $G_{23}$, respectively, since there are provided the delay circuit 512 having a delay time corresponding to one picture element and the delay circuit 513 having a delay time corresponding to two picture elements. In the multipliers 509, 511 and 510 multiplications $\alpha_4 G'_{22}$, $\alpha_5 G_{23}$ and $\alpha_6 G_{21}$ are conducted and the multiplied values are added together by the adder 505. In consequence, there is derived at the output terminal 203 image data in which the image data $G_{22}$ has been made sharp in the horizontal and vertical directions.

In each horizontal scanning period subsequent to the period T in which the image information of the picture elements $P_{21}$ to $P_{2n}$ have been made sharp in two dimensions as described above, only the analog switches $SW_{21}$, $SW_{32}$ and $SW_{43}$ are turned ON and the others OFF and image data $G_{31}$ to $G_{3n}$ are made sharp in the same manner as referred to above.

In the processing of the image data $G_{31}$ to $G_{3n}$, the stored information of the image sensor cells $P_{31}$ to $P_{3n}$ once read out on the readout line $l_3$ in the processing of the image data $G_{21}$ to $G_{2n}$ is read out again on the readout line $l_2$ and further read out on the readout line $l_1$ in the next subsequent processing of the image data $G_{41}$ to $G_{4n}$ as well. That is, the same image sensor cells, $P_{31}$ to $P_{3n}$ in this case, are read out a plurality of times. This indicates that in order for such a two-dimensional solid-state image sensor to perform two-dimensional image processing without using a large capacity buffer memory, it is necessary to employ the non-destructive readout technique which permits reread of image sensor cells once read out.

By repeating such processing of the image data $G_{11}$ to $G_{1n}$, $G_{21}$ to $G_{2n}$, ... $G_{m1}$ to $G_{mn}$ for increasing the image sharpness, the two-dimensional image processing can be effected in the image sensor when reading out the image information.

In this way, image data $G''_{11}$ to $G''_{mn}$ subjected to image processing are derived as a time series signal at the output terminal 203.

In this case, the two-dimensional image processing need not necessarily be performed for all of the image sensor cells $P_{11}$ to $P_{mn}$; it is also possible, of course, to selectively supply stored information of the principal portion of an image to the arithmetic unit and to output information of the other portions as it is.

While in the foregoing the present invention has been described as being applied to the case where stored information of each image sensor cell is read out together with stored information of image sensor cells before and behind it, it is also possible to read out each image sensor cell together with those disposed diagonally thereof, for instance. Further, it is also possible to arrange the photoelectric converter 200 so that the image sensor cells $P_{11}$ to $P_{mn}$ may be accessed simultaneously but independently, permitting simultaneous readout of image sensor cells on all sides of a cell desired to read out. The arrangement of the arithmetic unit 202 is properly modified in accordance with processing to be effected.

As has been described in the foregoing, according to the present invention, the photoelectric converter are formed by non-destructive readout type image sensor cells and the image sensor cells are scanned so that stored information of each of them is read out together with other cells bearing predetermined positional relationships to the cell desired to read out; accordingly simultaneous operation of a plurality of image information is possible. In addition, even if surrounding information necessary for two-dimensional image processing of a certain image information is once read out, the information is retained, so that the image information need not be loaded in a buffer memory or the like temporarily and no A-D converter is required for supplying the image information to such a buffer memory. Therefore, two-dimensional image processing can be achieved with a simple arrangement. Moreover, since analog information can directly be subjected to the two-dimensional image processing in the present invention, it is possible to enhance the image processing performance by direct processing of signals read out from the image sensor cells to minimize the influence of noise. Furthermore, the image processing function can be incorporated in the image sensor itself. Accordingly, two-dimensional solid-state image sensor of the present invention which is capable of directly providing image data subjected to two-dimensional image processing.

It will be apparent that many modifications and variations may be effected without departing from the scope of the novel concepts of the present invention.

What is claimed is:

1. A two-dimensional solid-state image sensor; comprising:

a photoelectric converter having non-destructive readout type image sensor cells arranged in a matrix form, each cell being exposable to light for producing stored information, each cell readable to read the stored information without destroying the stored information;

a scanner connected to the converter for scanning the converter in such a manner that stored information of each image sensor cell is read out at the same time as stored information of selected other image sensor cells which bear a predetermined positional relationship to the image sensor cell being read out; and an arithmetic unit connected to the scanner for conducting predetermined operations for a plurality of stored information read out by the scanner from each cell being read out and each selected other cell being read out to output an image signal which has been subjected to two-dimensional image processing.

2. A two-dimensional solid-state image sensor according to claim 1, wherein the non-destructive readout type image sensor cells are photoelectric conversion elements having a hook structure made of a plurality of semiconductor layers forming a transistor having an electrically floating base.

3. A two-dimensional solid-state image senor according to claim 1, wherein the scanner comprises a word line driver connected to said cells for sequentially selecting picture element trains each consisting of stored information from a plurality of image sensor cells arranged in a column direction on the photoelectric converter; a plurality of bit lines connected to said cells for taking out outputs from the image sensor cells of each picture element train selected by the work line driver; a plurality of analog switches respectively connected to each of the bit lines; a plurality of readout lines respectively connected to the analog switches; and a controller for performing ON-OFF control of the analog switches to simultaneously read out image information of the selected other image sensor cells bearing predetermined positional relationships.

4. A two-dimensional solid-state image sensor according to claim 1, wherein the arithmetic unit includes means for performing a convolution of each stored information of each cell and each selected other cell of the photoelectric converter and a predetermined two-dimensional weight function, thereby to provide for an increased image sharpness of a light image exposing the converter to produce stored information in the cells.

* * * * *